United States
Mueller

[11] 3,934,242
[45] Jan. 20, 1976

[54] ALPHANUMERIC DISPLAY MEANS FOR COMPUTER-LINKED TYPEWRITER CONSOLES USING A MATRIX ARRAY OF LIQUID-CRYSTAL DEVICES

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,112

[52] U.S. Cl..... 340/324 R; 340/365 R; 350/160 LC
[51] Int. Cl.² ........................ G06F 3/14; G02F 1/18
[58] Field of Search... 340/324 RM, 166 EL, 365 R, 340/365 C, 378; 350/160 LC

[56] References Cited
UNITED STATES PATENTS 3,654,606  4/1972  Marlowe et al. ............. 340/166 EL
3,670,322  6/1972  Mallebrein ..................... 340/365 C

*Primary Examiner*—Marshall M. Curtis
*Attorney, Agent, or Firm*—R. L. Freeland, Jr.; H. D. Messner

[57] ABSTRACT

The present invention relates to an alphanumeric display unit means for improving the identification quantities at selected key buttons of a computer-linked typewriter console through usage of identification indicia attached adjacent to or at the selected key buttons. Each display is in matrix format consisting of a set of liquid-crystal devices arranged in orthogonal rows and columns. Energization of each set of liquid-crystal devices is via digital control circuitry. Result: a repetitive display in matrix format in a configuration corresponding to an alphanumeric indicium for which display is sought.

2 Claims, 9 Drawing Figures

ALPHANUMERIC DISPLAY MEANS FOR COMPUTER-LINKED TYPEWRITER CONSOLES USING A MATRIX ARRAY OF LIQUID-CRYSTAL DEVICES

FIELD OF THE INVENTION

The present invention relates to key-operated typographical machines such as typewriters and the like, and more particularly, to a computer-linked typewriter console used as an input/output (I/O) linkage for a general purpose digital computer.

BACKGROUND OF THE INVENTION

Today's different programming languages (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement Also, in some cases it is desirable to "highlight" certain key buttons above those displayed at adjacent buttons owing to the importance of certain programming keys being implemented at the computer terminals. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted highly visible, alphanumeric display means for display of key alphanumeric indicia through selective control provided by controller switch means connected thereto. Preferably the display means includes a set of display matrices each composed of an array of liquid-crystal devices arranged in orthogonal rows and columns at the surface of one of the frame means visible to the observer-user. Energizating the array of liquid-crystal devices is by means of digital control circuitry which provides sets of matrix binary codes, each set including a series of multi-bit control subcodes for selectively energizing orthogonal row and column conductors of selected liquid-crystal devices within each matrix. Result: a pattern of light corresponding to the alphanumeric indicium for which display is sought. By recycling ("refreshing") the energization code of each matrix above the flicker fusion rate of the human eye, the resulting display appears as a solid image to the observer-user.

OBJECTS OF THE INVENTION

An object of the present invention is the provision of a novel, alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings in which:

DESCRIPTION OF A DETAILED EMBODIMENT

Figure 1:
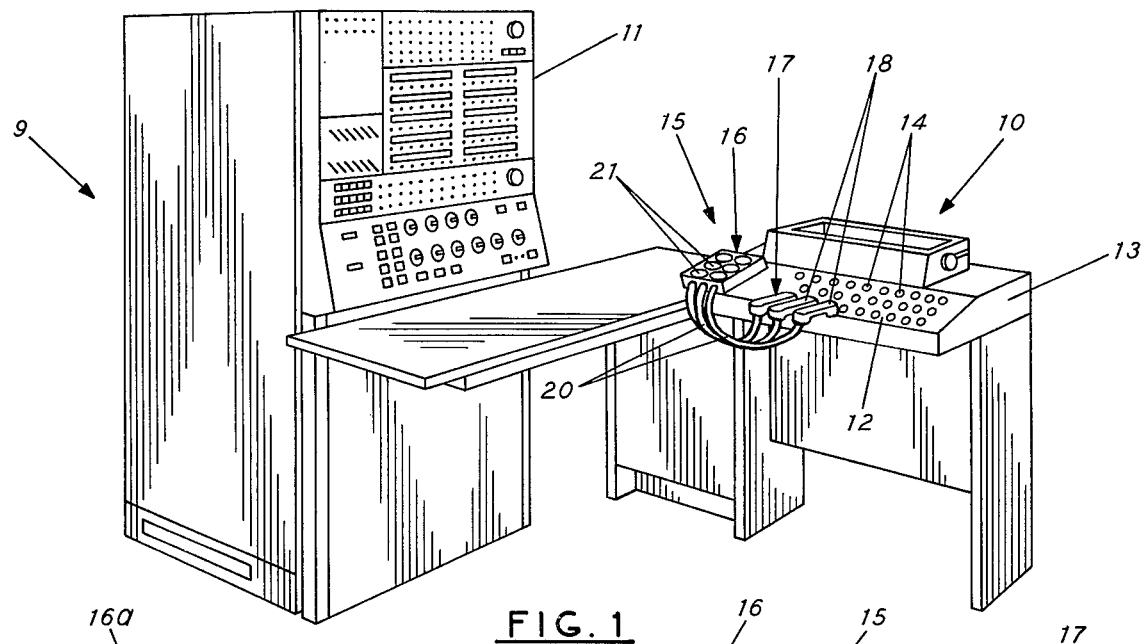
FIG. 1 is a perspective view of an I/O computer terminal which includes a typewriter console having a keyboard provided with, alphanumeric character displays positioned at selected key buttons in accordance with the present invention.

FIG. 1 illustrates a computer terminal 9. The computer terminal 9 includes an I/O typewriter console 10 useful in linking digital information to a general purpose digital computer (not shown). Information can be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizes key buttons 14 to depress levers (not shown) by which conventional font-paper interaction occurs while, simultaneously, the data is transmitted, after being compiled, to the general purpose digital computer. Keyboard 12 is conventionally arranged; e.g., as a series of rows and columns. Due to the fact that different programming languages used by various observer-users for computer control purposes may employ numerous characters, symbols and keys not readily interrelated, there is a definite need for identification means for attachment to selected key buttons 14. Preferably such identification means should highlight the display irrespective of the background lighting environment at the computer terminal 9. The present invention provides for such a display through a novel, display unit 15, attached to the typewriter console 10. In general, it comprises a controller switch unit 16 attached, say, to the housing 13 of the typewriter console 10, and an alphanumeric indicating unit 17 including a rigid frame means 18. Also of importance: transfer bundle means 20 connected between the controller switch unit 16 and the indicating unit 17. Each of the aforementioned elements will now be described in detail.

Controller Switch Unit 16

Figure 2:
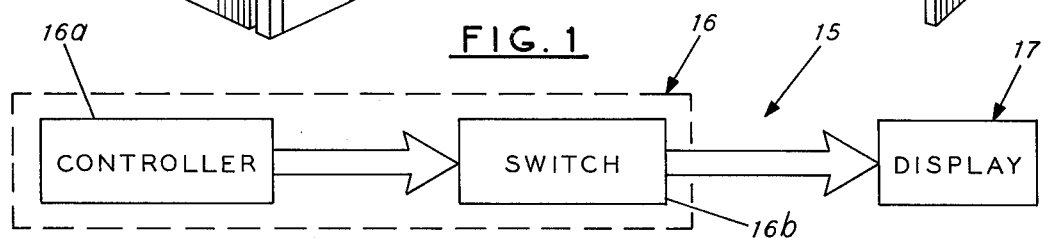
FIG. 2 is a schematic diagram of circuitry useful in the apparatus of the present invention.

As FIG. 1 illustrates, a controller switch unit 16 should be placed within arm's length of an observer-user seated at the typewriter console 10. To the broad horizontal surface of the unit are attached a series of buttons 21. Purpose: to effectuate control of the indicating 17 through digital controller 16a (FIG. 2) operating in conjunction with switch unit 16b, as explained below.

Figure 5:
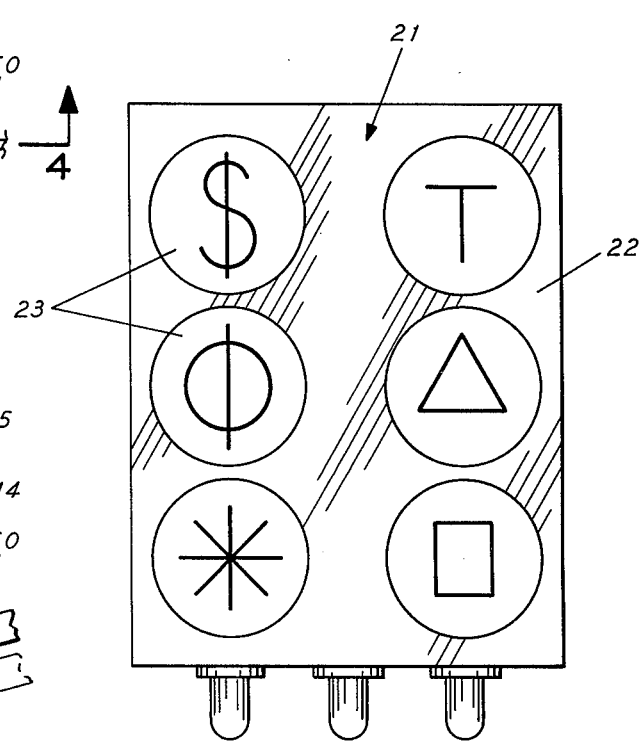
FIG. 5 is a plan view of an array of switch buttons useful in initializing circuit components within the apparatus of the present invention.

FIG. 5 illustrates the arrangement of buttons 21 in more detail. As shown, they are arranged as a matrix array comprising a series of orthogonal columns and rows extending well above the support housing 22. Tags 23 are attached to the upper broad surfaces of the buttons so as to allow easy identification to the observer-user. Operation of the buttons is straightforward: downward movement will cause switch elements (not shown) to change their operational state. As a result, initialization operations within the controller switch unit 16, as discussed below, occur.

Figure 6:
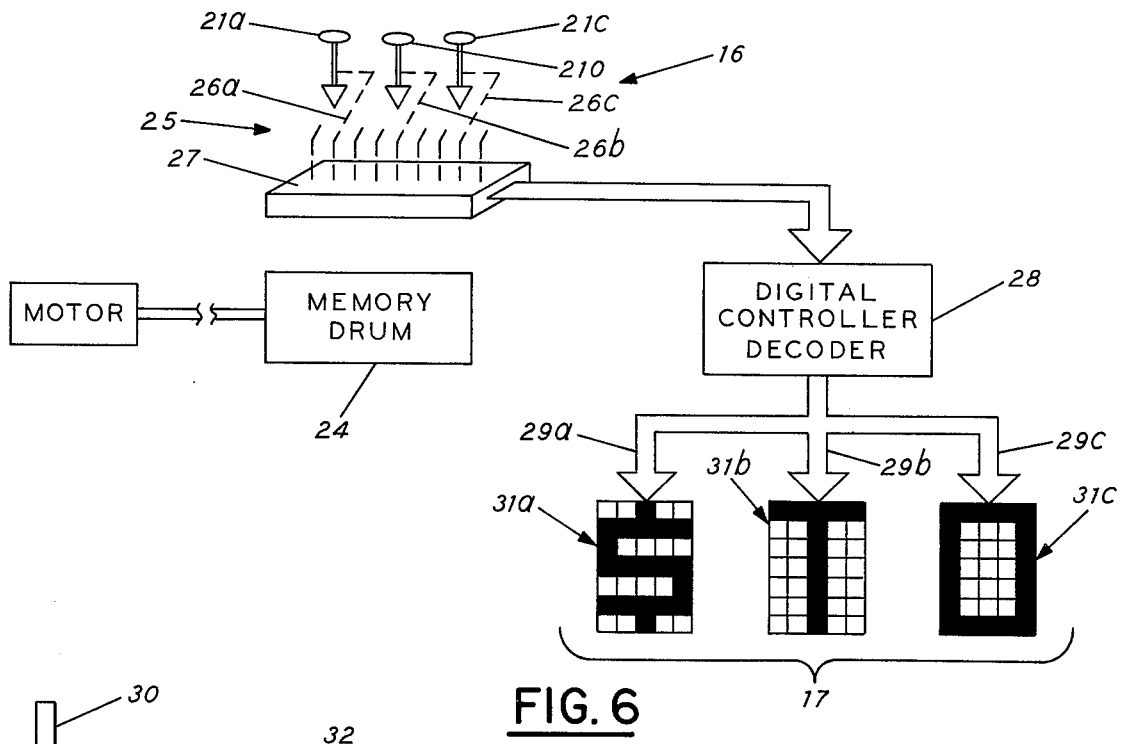
FIG. 6 is a schematic diagram of digital control circuitry useful in the apparatus of the present invention.
Figure 7:
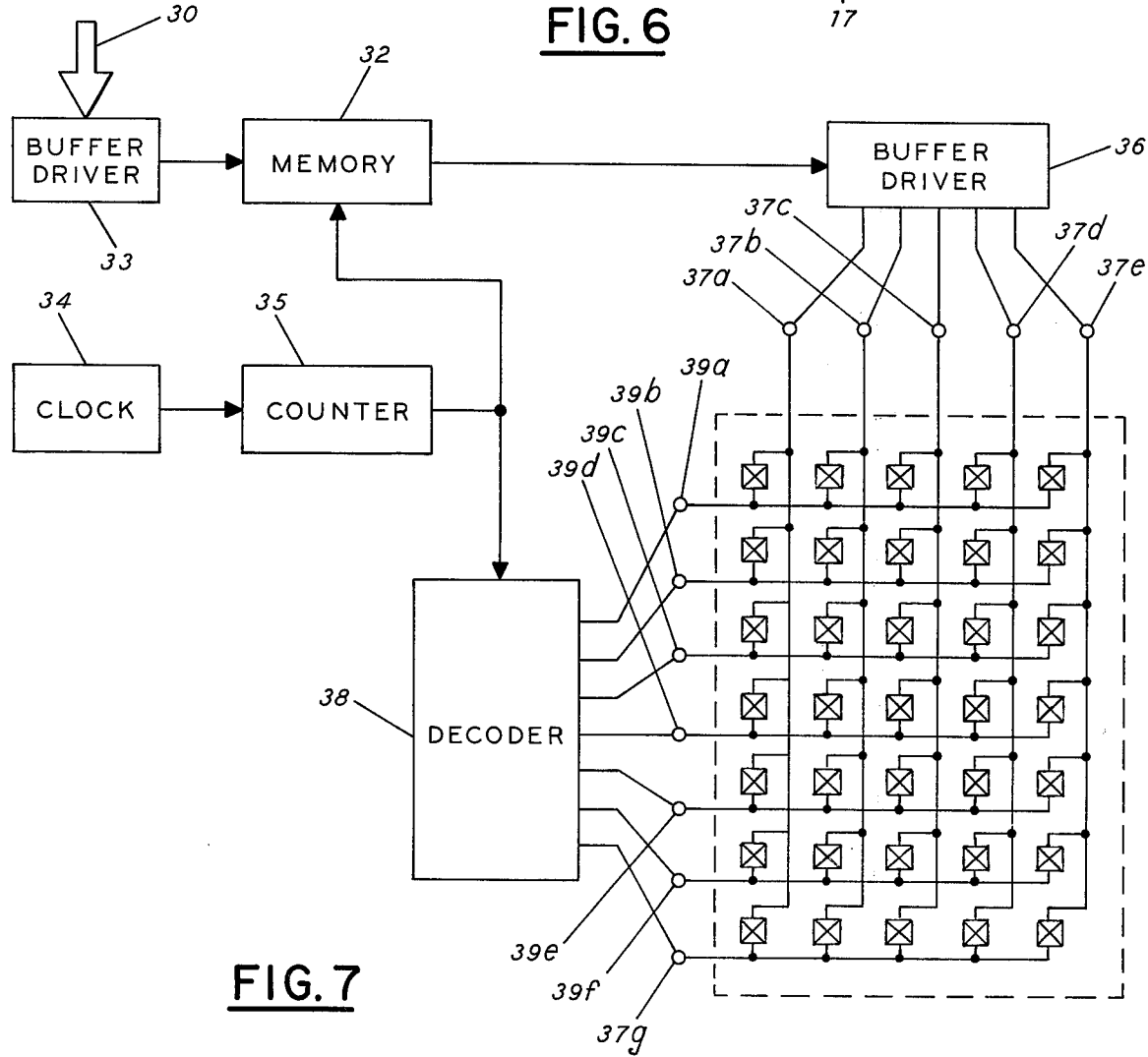
FIG. 7 is a detail schematic diagram of a digital controller-decoder useful in carrying out the present invention.

FIGS. 6 and 7 illustrate controller switch unit 16 in more detail.

With specific reference to FIG. 6, assume binary control-bit data has been encoded onto memory drum 24 as bit-channels, say under control of the buttons 21a, 21b and 21c in conjunction with read-write head unit 27. Each bit-channel comprises a binary code of bit information associated with a selected button 21a, 21b or 21c. For decoding purposes, assume that buttons 21a, 21b and 21c have undergone downward movement so as to change states of switch elements generally indicated at 25 of the switch unit 16b of FIG. 2 through operation of mechanical linkage 26a, 26b and 26c. As a result, three channels of binary data — initialization codes— are read into digital controller-decoder 28 via transfer lines 29a, 29b and 29c to display array matrices 31a, 31b or 31c constituting the indicating unit 17 of FIG. 2. Purpose of the initialization codes: to provide the digital controller-decoder 28 with switch control information by which it can generate via the transfer lines 29a, 29b and 29c sets of binary matrix codes. Such codes —in turn— generate patterns of light corresponding to alphanumeric indicia for which display is sought at the array matrices 31a, 31b and 31c, as explained in more detail below.

FIG. 7 illustrates digital controller-decoder 28 in more detail.

As shown, the sets of initialization codes are read into memory unit 32 via transfer line 30 through buffer driver 33. Synchronization signals are generated by master clock 34. Connected to clock 34 is binary counter 35 also connected to the memory unit 32. In operation, the binary codes previously read into the memory unit 32 are sequentially fetched from the latter through command signals generated by clock 34 and counter 35. The fetched codes then pass through buffer-driver 36 to terminals 37a–37e of a selected array matrix, say array matrix 31a. Similar command signals pass from the clock 34 and counter 35 to one-in-seven decoder 38 having a series of output terminals 39a–39g of the display matrix 31a. The buffer-driver 36 and the decoder 38 sequentially enable the columns and rows of conductors connected to the output terminals 37a–37e and 39a–39g as explained below in a selected manner whereby the display array matrices 31a is selectively activated. Result: a pattern of light is generated corresponding to the alphanumeric indicium for which display is sought. It should be apparent that the binary state (ONE, ZERO) of the subcodes at the terminals 37a–37e and 39a–39g determine display characteristics, and thus can be easily altered to provide new display patterns, as required. The activation code at the terminals 37a–37e not only relates to columnar matrix activation of the display matrix 31a, but also may contain certain control bit information; thus the resulting subcode can be called a "columnar control subcode." Likewise, the subcode passing from terminals 39a–39g of one-in-seven decoder 38 controls row matrix activation of the display matrix; thus such subcode can be called "row control subcodes." Together, these subcodes provide sets of matrix binary codes at each of the display array matrices 31a, 31b or 31c of FIG. 6.

Operation of the digital controller-decoder 28 will now be explained with reference to FIGS. 6 and 7.

For simplicity of discussion, assume at matrix displays 31a, 31b and 31c are as depicted in FIG. 6. Also assume that each matrix display 31a, 31b and 31c is composed of a set of liquid-crystal devices, each matrix being arranged in a series of orthogonal columns and rows, and being addressable by energization of selected row and columnar conductors via the aforementioned matrix binary codes. Since the individual liquid-crystal device is defined by an individual row and column intersection of conductors, it can be enabled by the ONE condition of the intersecting columnar and row subcodes, i.e., a ONE bit condition of each conductor line. For example, for the display indicia depicted in FIG. 6, i.e., at displays 31a, 31b, 31c, the columnar subcodes are as set forth in Table I below, such subcodes assuming columnar activation proceeds from left to right in each display and row activation proceeds from top to bottom, as viewed:

TABLE I

| Matrix Display 31a | | | | | | Matrix Display 31b | | | | | | Matrix Display 31c | | | | | |
|---|---|---|---|---|---|---|---|---|---|---|---|---|---|---|---|---|---|
| Rows | Columns | | | | | Rows | Columns | | | | | Rows | Columns | | | | |
| | 1 | 2 | 3 | 4 | 5 | | 1 | 2 | 3 | 4 | 5 | | 1 | 2 | 3 | 4 | 5 |
| 1 | 0 | 0 | 1 | 0 | 0 | 1 | 1 | 1 | 1 | 1 | 1 | 1 | 1 | 1 | 1 | 1 | 1 |
| 2 | 1 | 1 | 1 | 1 | 1 | 2 | 0 | 1 | 0 | 1 | 0 | 2 | 1 | 0 | 0 | 0 | 1 |
| 3 | 1 | 0 | 0 | 0 | 0 | 3 | 0 | 1 | 0 | 1 | 0 | 3 | 1 | 0 | 0 | 0 | 1 |
| 4 | 1 | 1 | 1 | 1 | 1 | 4 | 0 | 1 | 0 | 1 | 0 | 4 | 1 | 0 | 0 | 0 | 1 |
| 5 | 0 | 0 | 0 | 0 | 1 | 5 | 0 | 1 | 0 | 1 | 0 | 5 | 1 | 0 | 0 | 0 | 1 |
| 6 | 1 | 1 | 1 | 1 | 1 | 6 | 0 | 1 | 0 | 1 | 0 | 6 | 1 | 0 | 0 | 0 | 1 |
| 7 | 0 | 0 | 1 | 0 | 0 | 7 | 0 | 1 | 0 | 1 | 0 | 7 | 1 | 1 | 1 | 1 | 1 |

In this regard, as the one-in-seven decoder 38 of FIG. 7 selects the row for activation, the buffer-driver 36 provides the correct enablement pattern to the columns of conductors. For example, for row No. 1 of the display matrix 31a of Table I, decoder 38 would initially generate the following row columnar subcode: 1 0 0 0 0 0 0. Simultaneously, the buffer-driver 36 would provide the following columnar control subcode at terminals 37a–37e: 00100. As a result, only one liquid-crystal device in the above row-column intersection would be enabled. By recycling the subcodes at a rate well above the flicker fusion frequency of the human eye, however, the image of the display would appear as a solid light pattern to the human observer-user.

With regard to using liquid-crystal devices in a matrix format, attention should be had to Pat. No. 3,716,290 for "Liquid-Crystal Display Device" J. Borel et al., issued Feb. 13, 1973, in which activation of an array of liquid-crystal devices is discussed in detail.

Indicating Unit 17

Indicating unit 17 comprising liquid-crystal matrix devices is illustrated in detail in FIGS. 3, 4, 8 and 9. Before describing in detail the liquid-crystal matrices which comprise the indicating unit 17, perhaps a discussion of the operating principles of the former may be instructive.

Liquid-crystals are substances which exist in an intermediate state between crystalline (solid) and liquid forms. As is well known, electric fields can affect the optical reflectivity or transmissivity of the crystal. Normally, such crystals are transparent to light. But when a potential is impressed across the nematic liquid crystals between front and back support plates coated with conductive coatings, there is "dynamic scattering" of the light. See "Dynamic Scattering: A New Electro-Optical Effect in Certain Classes of Nematic Crystals," G. H. Heilmeier et al., Proc. of I.EEE Vol VI, No. 7, July 1968. Requirements of the liquid-crystal material are also well known: (1) it must have negative dielectric anisotrophy such that its dielectric dipole moment has a larger component normal to the molecular axis than parallel to the same axis; (2) it must conduct enough current to present a readable display. Related to (2), doping of the liquid-crystal material may be required to reduce resistivity from about $10^{12}$ ohm-cm to the order of $10^8$–$10^{11}$ ohm-cm.

Suitable liquid-crystal materials are set forth in detail in "A New Electric Field Controlled Reflective Optical Storage Effect in Mixed Crystal Systems," G. H. Heilmeier et al., Applied Physics Letters, Vol. 13, No. 4, p. 132; see also Pat. Nos. 3,716,289 for "Electro-Optic Devices Using Smectic-Nematic Mixtures," L. T. Creagh et al., and 3,732,429 for "Liquid-Crystal Device," M. Braunstein.

The chief principle of operation —dynamic scattering— can also be altered to provide a more sophisticated device —called a field effect liquid-crystal device— wherein the liquid-crystal device either does or does not rotate the plane of polarization of polarized light passing through it. Its operative effect is again dependent upon whether a voltage is applied across the liquid-crystal material. In addition to the front and back support plate package previously described appropriately carring conduction and liquid-crystal materials thereon, a pair of polarizers are placed on opposite sides of the support plates. Prior to assembly, inner surfaces of the front and back plates have undergone orthogonal molecular realignment. Result: when the liquid crystal material is applied, the molecules of the latter are "line up" along one face of one of the plates, at right angles with corresponding alignment at the opposite face. However, a gradual twisting with distance exists over the central region of the liquid-crystal material. Since the dimensions of the latter-mentioned twisting is kept many times greater than the wavelengths of usable light, polarized light entering the device can follow such "twists" and emerge parallel to the rubbed direction of the second face. However, under an applied electrical field, the transmissive effects of liquid-crystal material is altered (i.e., it is "untwisted") so that the plane of polarization of the passing light is no longer altered. Normally, a diffuser-reflector is placed behind the rear polarizer to assure that the light reflected is not polarized. Also, crossed polarizers are used at opposite sides of the broad surfaces of the liquid-crystal package. Result: displays that are normally bright turn dark in the presence of an applied electric field.

Figure 3:
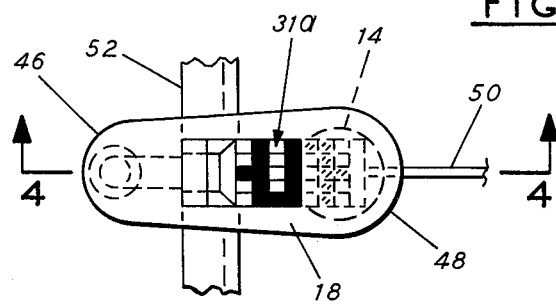
FIG. 3 is a plan view of a rigid frame means attached to a selected key button of the typewriter console of FIG. 1.
Figure 4:
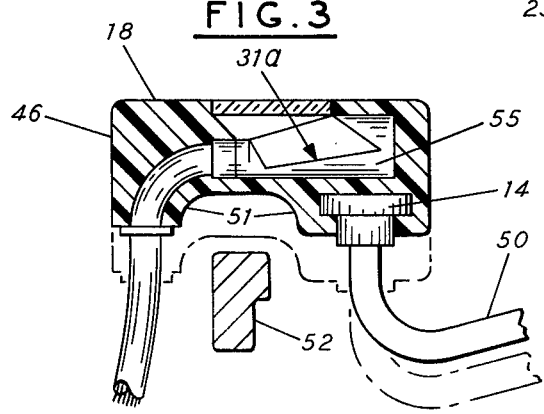
FIG. 4 is a section taken along line 4—4 of FIG. 3.

Now returning to the figures and particularly to FIGS. 3 and 4, in which either of the aforementioned liquid-crystal devices can be used, note that the transfer bundle means 20 is seen to connect to one of the liquid-crystal display matrices, say, to display matrix 31a, through the rigid frame means 18 previously mentioned. The frame means 18 includes a cantilevered end 46 and a support end 48. The support end 48 attaches to a selected key button 14 as shown in FIG. 4. Over the central region of the frame 18 there is a reduction in thickness to form steps 51. In that way when the keyboard button 14 is depressed whereby key lever 50 is likewise downwardly depressed, there is sufficient clearance of these elements with regard to lip 52 of the typewriter housing.

As shown in FIG. 4, the liquid-crystal display matrix 31a, say a 7 × 5 matrix, to be supported within the frame means 18 at a broad surface thereof of a separate support housing 55.

Figure 9:
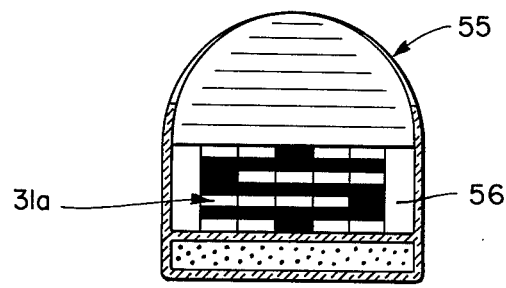
FIG. 9 is a section taken along line 9—9 of FIG. 8.
Figure 8:
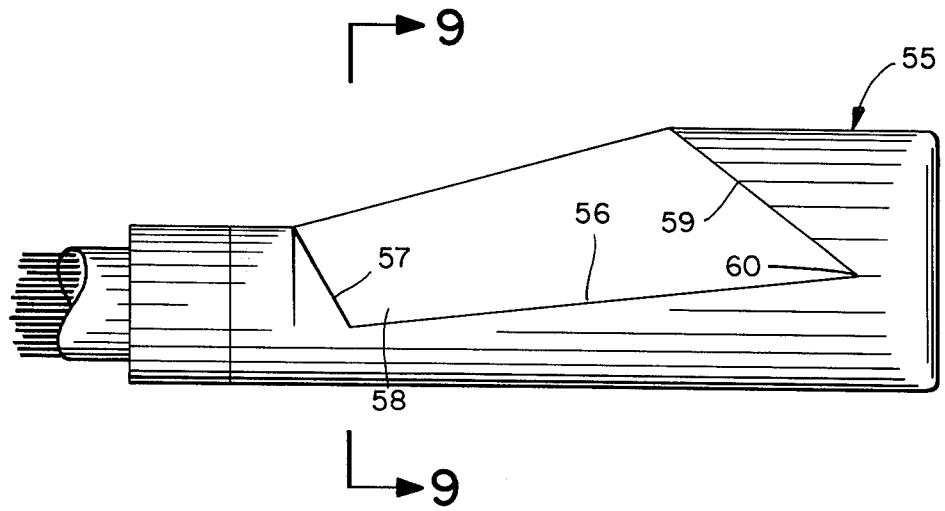
FIG. 8 is a detail of a liquid-crystal matrix support means supported in the rigid frame means of FIGS. 3 and 4.

FIGS. 8 and 9 illustrate housing 55 in more detail.

As shown in FIG. 8, the housing 55 also includes inwardly stepped near wall 57 joined to broad surface 56 at junction 58, and outwardly stepped nonreflecting rear wall 59 joined to the broad surface 56 at junction 60. Purpose of wall 59: to enhance viewability of the liquid matrix 31a from an observation area to be occupied by the eyes of the observer-user, by reducing reflections. In this regard, perhaps a brief review of the problems inherent in the display of alphanumeric indicia using liquid-crystal matrix displays may be instructive.

Although such displays can be typed by the operating principle involved (i.e., with dynamic scattering or field-effect modes, as hereinbefore discussed), the travel direction of light also characterizes the display as operatable in either a transmission mode or reflective mode. Note that the transmission mode requires the use of an external light source at the display, however. Since ambient light sources at computer terminals are unusually good, only reflective displays using either dynamic scatter or field effect operating modes are contemplated in the apparatus of the present invention.

For example, in the display matrix 31a of FIG. 9, assuming a reflective display has been provided, i.e., a reflective conductive material has been buried at the interior surface of the back support plate of the liquid-crystal device. Assume also that the dynamic scatter principle is the mode of operation. Result: the matrix display 31a would provide a pattern of light ("dull white") which corresponds to the alphanumeric indicium for which display is sought. Such pattern would appear in a mirrored background, however, except for the nonreflection quality of rear wall 59 which alters the display to present a pleasant white-on-black pattern to the observer-user. Although field-effect devices overcome the aforementioned specular reflection problems somewhat by presenting a pleasant black-on-white display, they can suffer parallax problems making them difficult to read off axis. However, because the distance between the observer-user and the display matrices 31*a*, 31*b* or 31*c* is reasonably short, displays of the present invention including field-effect displays are not unduly affected by the above-mentioned problems.

While certain preferred embodiments of the invention have been specifically disclosed, it should be understood that the invention is not limited thereto. For example, if the dimensions of the liquid-crystal display matrix 31*a* are reduced, the supporting housing within each key button 14 may be sufficient to support the former. In such an arrangement, a selected key button 14 would be provided with a bore which would then accept a display array matrix. The resulting array would be directly viewable by the observer-user. Furthermore, it should be noted that the liquid-crystal display hereinbefore described could be altered to include these variations from the aforementioned matrix format: (i) a "figure eight" configuration with seven variable inputs to each display; (ii) a "crossed figure eight" configuration with nine variable inputs, or.(iii) a special purpose display in a pattern of the desired alphanumeric indicia sought to be displayed, with only one variable input required.

I claim:

1. A device for displaying alphanumeric indicia at selected key buttons of a keyboard of a typewriter console forming an I/O link with a general-purpose digital computer, each alphanumeric indicium being related to a font operational characteristic resulting from movement of one of said selected key buttons under control of a human observer-user whereby said font operational characteristic is permanently recorded on paper at said typewriter console in full view of said human observer-user through mechanical button-font-paper interaction, comprising:

a. sets of liquid-crystal devices, each set being arranged to display at or adjacent to at least one of said selected key buttons said alphanumeric indicium associated with said font operational characteristic;

b. elongated rigid cantilevered frame means attached to and supportive of said sets of liquid-crystal device, said frame means including cooperative gripping means in contact with corresponding key buttons of said keyboard;

c. controller switch means connected to said sets of liquid-crystal devices and including digital controller-decoder means for repetitively generating a binary activation code for each set at a rate sufficiently above the flicker fusion rate of the human eye to display said desired alphanumeric display indicium as a solid image to said observer-user, said displayed alphanumeric indicium being of sufficient intensity so as to be easily discernible to said human observer-user using said typewriter console irrespective of the background lighting environment thereabout.

2. Device of claim 1 which said set of liquid-crystal devices is supported interior of said one key button of said keyboard, said set being viewable at the finger-touching surface of said one key button.

* * * * *